United States Patent
Payne et al.

(10) Patent No.: US 10,659,059 B2
(45) Date of Patent: May 19, 2020

(54) MULTI-PHASE CLOCK GENERATION CIRCUIT

(71) Applicant: TEXAS INSTRUMENTS INCORPORATED, Dallas, TX (US)

(72) Inventors: Robert Floyd Payne, Lucas, TX (US); Olga Pavlovna Pope, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/454,982

(22) Filed: Jun. 27, 2019

(65) Prior Publication Data
US 2020/0106450 A1 Apr. 2, 2020

Related U.S. Application Data

(60) Provisional application No. 62/739,940, filed on Oct. 2, 2018.

(51) Int. Cl.
*H03L 7/081* (2006.01)
*H03F 3/68* (2006.01)
*H03D 7/12* (2006.01)
*H03F 3/45* (2006.01)

(52) U.S. Cl.
CPC .......... *H03L 7/0818* (2013.01); *H03D 7/125* (2013.01); *H03F 3/45183* (2013.01); *H03F 3/68* (2013.01); *H03F 2203/45026* (2013.01); *H03F 2203/45374* (2013.01)

(58) Field of Classification Search
USPC .................. 327/147–149, 156–158
See application file for complete search history.

(56) References Cited

U.S. PATENT DOCUMENTS

| 7,233,772 B1* | 6/2007 | Darabi | H03B 21/01 323/237 |
| 7,496,168 B2* | 2/2009 | Leonowich | H03L 7/081 327/156 |
| 8,718,217 B2* | 5/2014 | Walker | H03L 7/087 327/148 |
| 2007/0109058 A1* | 5/2007 | Kim | H03F 3/45183 331/45 |
| 2010/0090733 A1* | 4/2010 | Kristensson | H03L 7/085 327/156 |
| 2010/0090736 A1* | 4/2010 | Kim | H03L 7/07 327/158 |
| 2010/0091927 A1* | 4/2010 | Walker | H03L 7/087 375/374 |

(Continued)

Primary Examiner — Adam D Houston
(74) Attorney, Agent, or Firm — Michael A. Davis, Jr.; Charles A. Brill; Frank D. Cimino

(57) ABSTRACT

A multi-phase clock circuit includes a first delay circuit, a second delay circuit, a third delay circuit, a first clock mixer circuit, and a second clock mixer circuit. The first, second, and third delay circuits are coupled in series. The first clock mixer circuit includes a first input and a second input. The first input is coupled to an output of the first delay circuit. The second input is coupled to an output of the second delay circuit. The second clock mixer circuit also includes a first input and a second input. The first input of the second clock mixer circuit is coupled to an output of the second delay circuit. The second input of the second clock mixer circuit is coupled to an output of the third delay circuit.

18 Claims, 3 Drawing Sheets

(56) References Cited

U.S. PATENT DOCUMENTS

| | | | |
|---|---|---|---|
| 2010/0281289 A1* | 11/2010 | Chang | G06F 13/1689 |
| | | | 713/400 |
| 2011/0018599 A1* | 1/2011 | Abbasfar | H04L 25/03878 |
| | | | 327/158 |
| 2011/0043296 A1* | 2/2011 | Moh | H03D 7/1441 |
| | | | 332/170 |
| 2014/0031076 A1* | 1/2014 | Tang | G01R 31/2832 |
| | | | 455/550.1 |
| 2015/0222274 A1* | 8/2015 | Cenger | H03L 7/08 |
| | | | 327/156 |
| 2018/0152192 A1* | 5/2018 | Tsai | H03L 7/087 |
| 2019/0173501 A1* | 6/2019 | Oh | H04B 1/0028 |

\* cited by examiner

MULTI-PHASE CLOCK GENERATION CIRCUIT

CROSS-REFERENCE TO RELATED APPLICATIONS

The present application claims priority to U.S. Provisional Patent Application No. 62/739,940, filed Oct. 2, 2018, entitled "Method and Circuit to Improve Accuracy of Multi-Phase Clock Generation," which is hereby incorporated herein by reference in its entirety.

BACKGROUND

In electronic systems, the speed with which operations are performed is based, in part, on the speed of clocks used to drive the timing of synchronous circuitry. Different frequencies of clock signals can drive different circuits to control their speed of operation. Multi-phase clocks are also useful in many applications. Multi-phase clocks are clock signals that have the same frequency but different phases. Multi-phase clock generators are circuits that produce multi-phase clock signals. Multi-phase clocks are used in a wide variety of applications. For example, multi-phase clocks are used in high-speed serial communication systems, wide-band wireless systems, time-interleaved systems, clock multiplier circuits, and other applications.

SUMMARY

A multi-phase clock generation circuit that reduces the phase error accumulated across multiple clock phases is disclosed herein. In one example, a multi-phase clock circuit includes a first delay circuit, a second delay circuit, a third delay circuit, a first clock mixer circuit, and a second clock mixer circuit. The first delay circuit, the second delay circuit, and the third delay circuit are coupled in series. The first clock mixer circuit includes a first input and a second input. The first input is coupled to an output of the first delay circuit. The second input is coupled to an output of the second delay circuit. The second clock mixer circuit also includes a first input and a second input. The first input of the second clock mixer circuit is coupled to an output of the second delay circuit. The second input of the second clock mixer circuit is coupled to an output of the third delay circuit.

In another example, a multi-phase clock circuit includes a delay-locked loop, a first clock mixer circuit, and a second clock mixer circuit. The delay-locked loop includes a first delay circuit, a second delay circuit, and a third delay circuit. The first delay circuit is coupled to a clock source, and is configured to delay a first clock signal received from the clock source. The second delay circuit is coupled to the first delay circuit, and is configured to delay a second clock signal received from the first delay circuit. The third delay circuit is coupled to the second delay circuit, and is configured to delay a third clock signal received from the second delay circuit to produce a fourth clock signal. The first clock mixer circuit is coupled to the first delay circuit and the second delay circuit, and configured to combine the second clock signal and the third clock signal. The second clock mixer circuit is coupled to the second delay circuit and the third delay circuit, and is configured to combine the third clock signal and the fourth clock signal.

In a further example, A multi-phase clock circuit includes a first delay circuit, a second delay circuit, a third delay circuit, a first clock mixer circuit, and a second clock mixer circuit. The first clock mixer circuit includes a first differential amplifier and a second differential amplifier. The first differential amplifier includes a differential input coupled to a differential output of the first clock generator circuit. The second differential amplifier includes a differential input coupled to differential output of the second delay circuit, and a differential output coupled to a differential output of the first differential amplifier. The second clock mixer circuit includes a third differential amplifier and a fourth differential amplifier. The third differential amplifier includes a differential input coupled to the differential output of the second clock generator circuit. The fourth differential amplifier includes a differential input coupled to differential output of the third delay circuit, and a differential output coupled to a differential output of the third differential amplifier.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Multi-phase clock generation circuits use delay-locked loops, phase-locked loops, poly-phase filters, or other phase shifting circuitry to generate multiple phases of a clock signal. In each of the various techniques used to generate multiple clock phases, error in an output clock phase, relative to an ideal clock phase, can result from random mismatch of circuit elements, such as transistors, resistors, capacitors, inductors, or any other circuit components that generate phase delays. These phase errors can be detrimental to system performance. For example, in some multi-phase clock generators, phase errors accumulate across the generation of the different clock phases such that the phase error increases with each successive clock phase. The phase errors make the absolute and relative phases of clock signals uncertain and the operating frequency of a system may need to be limited to accommodate the phase uncertainty. Some multi-phase clock generation circuits attempt to reduce phase error accumulation by using physically large transistors and high currents to reduce susceptibility to random mismatch induced errors. Increased device size and current utilization are generally undesirable.

The multi-phase clock generation circuits disclosed herein include clock mixer circuits that reduce phase error without increasing transistor size or current. The circuits average multiple clock phase input signals to produce multiple clock phase output signals having less relative phase error than is present across the clock phase input signals. For example, in an implementation that generates multi-phase clock signals differing in phase by 45°, each clock mixer circuit may average two clock phase input signals differing in phase by 45°, two clock phase input signals differing in phase by 90°, etc. Implementations of the multi-phase clock generation circuits are useful in applications, such as clock and data recovery systems, where reduction of relative phase error across multiple clock phases can improve performance.

Implementations of the clock mixer circuits may include at least two differential amplifiers, where each differential amplifier receives a different clock phase input signal and the differential outputs of the amplifiers are connected to one another. In some implementations, the differential amplifiers of a clock mixer circuit are coupled to a common tail current source.

Figure 1:
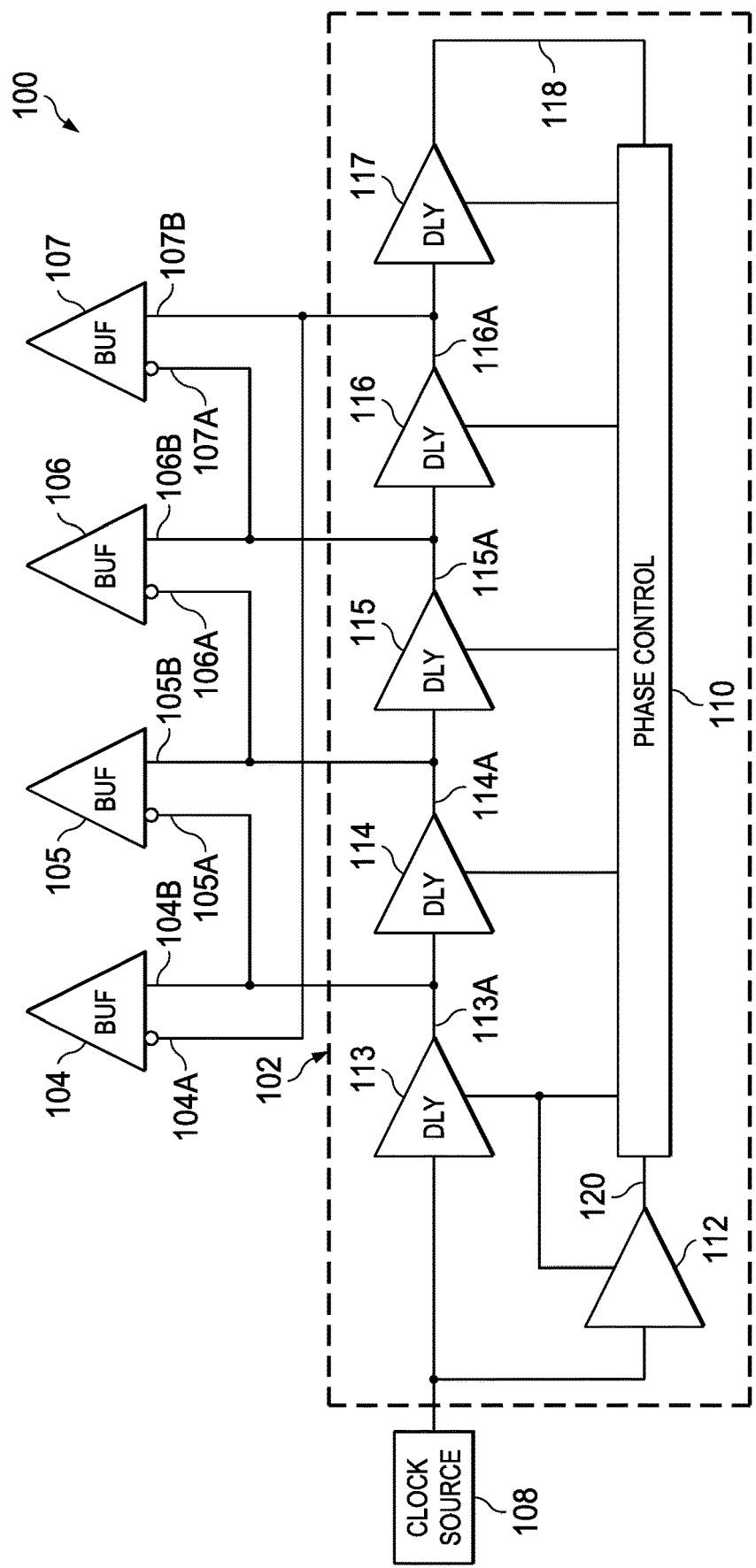
FIG. 1 shows a block diagram for an example multi-phase clock generation circuit in accordance with this description.

FIG. 1 shows a block diagram for an example multi-phase clock generation circuit 100 in accordance with this description. The multi-phase clock generation circuit 100 includes a clock control circuit 102 and a plurality of clock mixer circuits 104-107. While the multi-phase clock generation circuit 100 is illustrated as including four clock mixer circuits, implementations of the multi-phase clock generation circuit 100 may include two or more clock mixer circuits. The clock control circuit 102 is illustrated as a delay-locked loop (DLL) in FIG. 1. In some implementations of the multi-phase clock generation circuit 100, the clock control circuit 102 may be implemented as a phase-locked loop (PLL) or polyphase filters. The clock control circuit 102 is coupled to a clock source 108. The clock source 108 may be an oscillator or other clock signal generator.

The clock control circuit 102 includes a plurality of delay circuits 112-117 and a phase control circuit 110. Some implementations of the clock control circuit 102 may include a different number of delay circuits than are shown in FIG. 1. The phase control circuit 110 is coupled to each of the delay circuits and controls the propagation time through the delay circuits to produce synchronization of the signal 118 output by the chain of delay circuits and the signal 120 output by the delay circuit 112. For example, the phase control circuit 110 may adjust the delay circuits 112-117 so that the signal 118 is 180° out of phase with (inverted with respect to) the signal 120, thereby producing a 45° phase shift in each of the delay circuits 112-117. Operation of a PLL-based or polyphase filter-based implementation of the clock control circuit 102 is similar to the DLL, where the phase control circuit 110 adjusts the delay circuits of a ring oscillator of the PLL or adjusts filter components of the polyphase filter to achieve a desired cumulative phase shift. Mismatch of the components of the delay circuits 113-117 causes differences in the delays produced by the delay circuits 113-117, which causes errors in the phase of the clock signals at the output of the delay circuits 113-117.

The clock mixer circuits 104-107 are coupled to the delay circuits 113-117. Each of the clock mixer circuits 104-107 is coupled to two of the delay circuits 113-117. Each clock mixer circuit receives the clock signals output by two of the delay circuits 113-117 and generates an output that is an average of the two received clock signals. The averaging reduces the relative difference in phase across the outputs of the clock mixer circuits 104-107. In the implementation of the multi-phase clock generation circuit 100 shown in FIG. 1, each clock mixer circuit averages two clock signals (i.e., outputs of two of the delay circuits 113-117) that nominally differ in phase by 45°. Given that the input to the delay circuit 113 has 0° of phase shift, the clock mixer circuit 104 mixes the output signal of the delay circuit 113 (45° phase shift with the phase error of the delay circuit 113) with the inverse of the output signal of the delay circuit 116 (0° phase shift with the phase error accumulated through the delay circuits 113-116) to create an output clock signal having a phase that is the average of the phase of the output signal of the delay circuit 116 and the phase of the output signal of the delay circuit 113. The clock mixer circuit 104 includes an input 104A coupled to the output 116A of the delay circuit 116, and includes an input 104b coupled to the output 113A of the delay circuit 113.

The clock mixer circuit 105 includes an input 105A coupled to the output 113A of the delay circuit 113, and includes an input 105b coupled to the output 114A of the delay circuit 114. The clock mixer circuit 105 mixes the output signal of the delay circuit 114 (90° phase shift with the phase error accumulated through the delay circuits 113-114) with the output signal of the delay circuit 113 (45° phase shift with the phase error of the delay circuit 113) to create an output clock signal having a phase that is the average of the phase of the output signal of the delay circuit 114 and the phase of the output signal of the delay circuit 113.

The clock mixer circuit 106 includes an input 106A coupled to the output 114A of the delay circuit 114, and includes an input 106b coupled to the output 115A of the delay circuit 115. The clock mixer circuit 106 mixes the output signal of the delay circuit 115 (135° phase shift with the phase error accumulated through the delay circuits 113-115) with the output signal of the delay circuit 114 (90° phase shift with the phase error accumulated through the delay circuits 113-114) to create an output clock signal having a phase that is the average of the phase of the output signal of the delay circuit 115 and the phase of the output signal of the delay circuit 114.

The clock mixer circuit 107 includes an input 107A coupled to the output 115A of the delay circuit 115, and includes an input 107b coupled to the output 116A of the delay circuit 116. The clock mixer circuit 107 mixes the output signal of the delay circuit 116 (180° phase shift with the phase error accumulated through the delay circuits 113-116) with the output signal of the delay circuit 115 (135° phase shift with the phase error accumulated through the delay circuits 113-115) to create an output clock signal having a phase that is the average of the phase of the output signal of the delay circuit 116 and the phase of the output signal of the delay circuit 115. The mixing provided by the clock mixer circuits 104-107 shifts the phase of the output signals of the clock mixer circuits 104-107 by −22.5°, and increases the phase error in the output signal of the clock mixer circuit 104, but reduces the range of phase error over the output signals of the clock mixer circuits 104-107.

Figure 2:
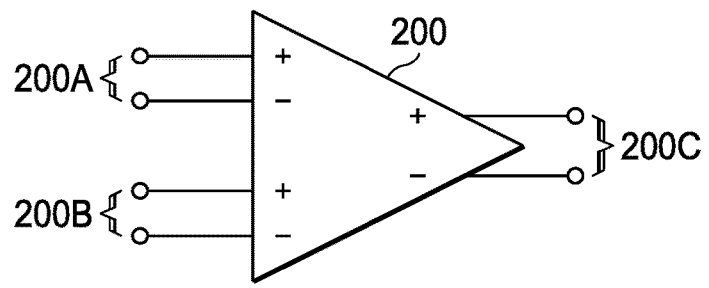
FIG. 2 shows an example clock mixer circuit in accordance with this description.

Implementations of the delay circuits 113-117 and the clock mixer circuits 104-107 include differential inputs and outputs. FIG. 2 shows an example clock mixer circuit 200 that includes differential input and output. The clock mixer circuit 200 is an implementation of the clock mixer circuit 104, the clock mixer circuit 105, the clock mixer circuit 106, or the clock mixer circuit 107. The clock mixer circuit 200 includes differential inputs 200A, differential inputs 200B, and differential output 200C. In an implementation of the multi-phase clock generation circuit 100, the differential inputs 200A are coupled to the differential outputs of a first (e.g., delay circuit 114) of the delay circuits 113-117, and the differential inputs 200B are couple to the differential outputs of a second (e.g., delay circuit 114) of the delay circuits 113-117.

Figure 3:
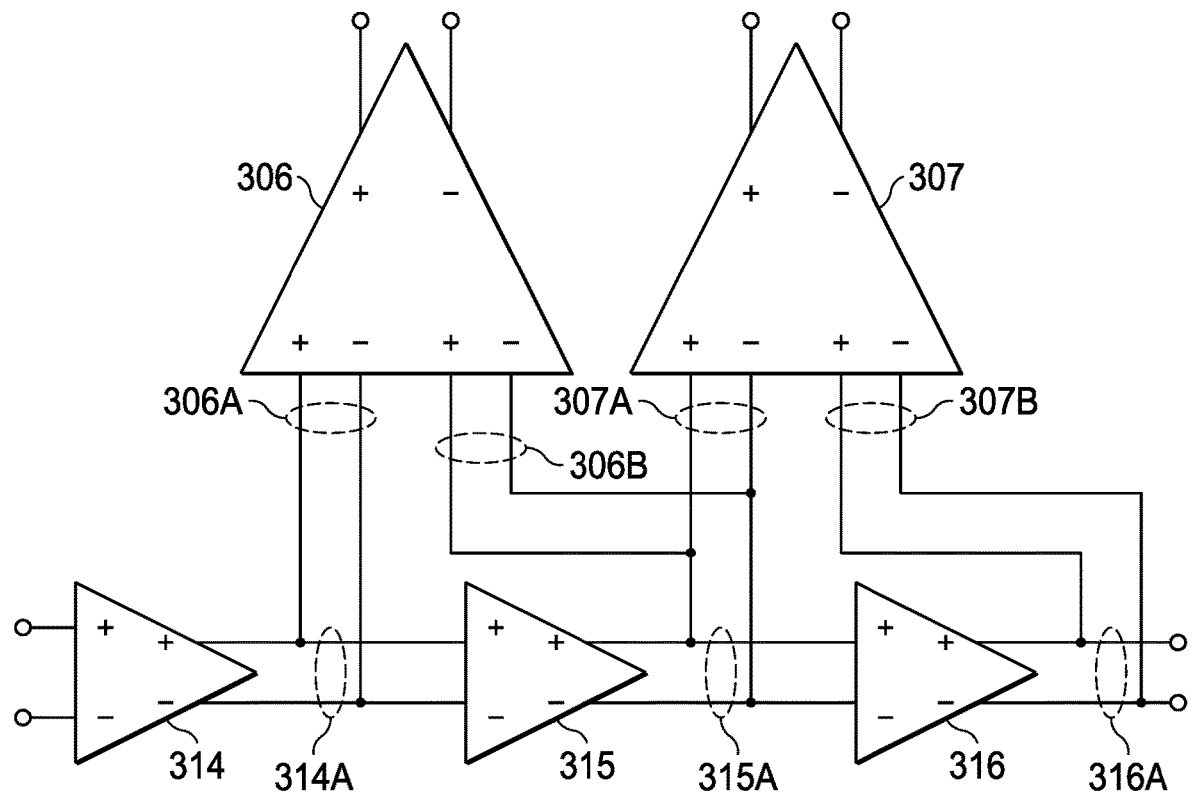
FIG. 3 shows an example of differential connections in a multi-phase clock generation circuit in accordance with this description.

FIG. 3 shows an example of differential connections in a multi-phase clock generation circuit in accordance with this description. In FIG. 3, delay circuits 314-316 correspond to the delay circuits 114-116 of FIG. 1, and the clock mixer circuits 306-307 correspond to the clock mixer circuits 106-107 of FIG. 1. The differential inputs 306A of the clock mixer circuit 306 are coupled to the different outputs 314A of the delay circuit 314, and the differential inputs 306B of the clock mixer circuit 306 are coupled to the different outputs 315A of the delay circuit 315. Similarly, the differential inputs 307A of the clock mixer circuit 307 are coupled to the different outputs 315A of the delay circuit 315, and the differential inputs 307B of the clock mixer circuit 307 are coupled to the different outputs 316A of the delay circuit 316.

Figure 4:
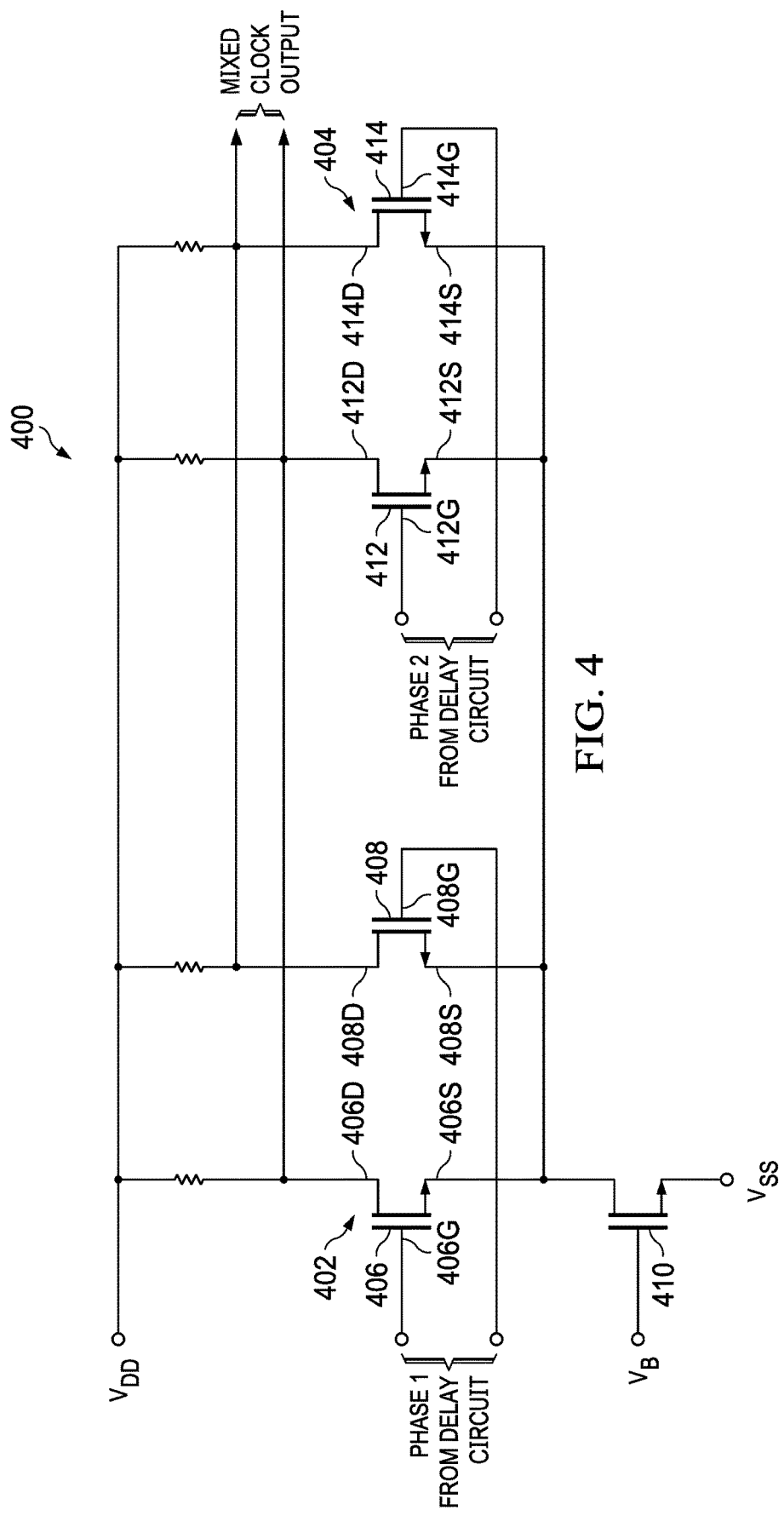
FIG. 4 shows a schematic diagram for an example clock mixer circuit in accordance with this description.

FIG. 4 shows a schematic diagram for an example clock mixer circuit 400 in accordance with this description. The clock mixer circuit 400 is an implementation of the clock mixer circuit 306, the clock mixer circuit 307, the clock mixer circuit 104, the clock mixer circuit 105, the clock mixer circuit 106, or the clock mixer circuit 107. The clock mixer circuit 400 includes a differential amplifier 402 and a differential amplifier 404. The differential amplifier 402 includes a transistor 406 and a transistor 408. A source terminal 406S of the transistor 406 is coupled to a source terminal 408S of the transistor 408. A gate terminal 406G of the transistor 406, which serves as in input terminal for the differential amplifier 402, is to couple to a first output of a first (e.g., delay circuit 314) of the delay circuits 314-316. A gate terminal 408G of the transistor 408, which serves as in input terminal for the differential amplifier 402, is to couple to a second output of the first (e.g., delay circuit 314) of the delay circuits 314-316. Thus, the gate terminal 406G and the gate terminal 408G correspond to the differential inputs 306A of the clock mixer circuit 306.

The differential amplifier 404 includes a transistor 412 and a transistor 414. A source terminal 412S of the transistor 412 is coupled to a source terminal 414S of the transistor 414. A gate terminal 412G of the transistor 412, which serves as in input terminal for the differential amplifier 404, is to couple to a first output of a first (e.g., delay circuit 315) of the delay circuits 314-316. A gate terminal 414G of the transistor 414, which serves as in input terminal for the differential amplifier 404, is to couple to a second output of the first (e.g., delay circuit 315) of the delay circuits 314-316. Thus, the gate terminal 412G and the gate terminal 414G correspond to the differential inputs 306B of the clock mixer circuit 306. A drain terminal 412D of the transistor 412 (which serves as an output terminal for the differential amplifier 404) is coupled to a drain terminal 406D of the transistor 406 (which serves as an output terminal for the differential amplifier 402), and a drain terminal 414D of the transistor 414 (which serves as an output terminal for the differential amplifier 404) is coupled to a drain terminal 408D of the transistor 408 (which serves as an output terminal for the differential amplifier 402) to provide the output of the clock mixer circuit 400.

The source terminal 406S of the transistor 406, the source terminal 408S of the transistor 408, the source terminal 412S of the transistor 412, and the source terminal 414S of the transistor 414 are coupled to a single common tail current source 410 in some implementations of the clock mixer circuit 400.

Modifications are possible in the described embodiments, and other embodiments are possible, within the scope of the claims.

What is claimed is:

1. A multi-phase clock generation circuit, comprising:
   a first delay circuit including first and second delay outputs, a second delay circuit including third and fourth delay outputs, and a third delay circuit including a fifth delay output, in which the first, second and third delay circuits are coupled in series;
   a first clock mixer circuit including:
     a first differential amplifier including first and second input terminals and first and second output terminals, the first input terminal coupled to the first delay output, and the second input terminal coupled to the second delay output; and
     a second differential amplifier including third and fourth input terminals and third and fourth output terminals, the third input terminal coupled to the third delay output, the fourth input terminal coupled to the fourth delay output, the third output terminal coupled to the first output terminal, and the fourth output terminal coupled to the second output terminal; and
   a second clock mixer circuit including fifth and sixth input terminals, the fifth input terminal coupled to the third delay output or to the fourth delay output, and the sixth input terminal coupled to the fifth delay output.

2. The multi-phase clock generation circuit of claim 1, wherein:
   the first delay circuit is configured to generate, at the first and second delay outputs, a first phase of a clock signal;
   the second delay circuit is configured to generate, at the third and fourth delay outputs, a second phase of the clock signal; and
   the third delay circuit is configured to generate, at the fifth delay output, a third phase of the clock signal.

3. The multi-phase clock generation circuit of claim 1, wherein:
   the first delay circuit includes a first circuit input adapted to be coupled to a clock;
   the second delay circuit includes second and third circuit inputs, in which the second circuit input is coupled to the first delay output, and the third circuit input is coupled to the second delay output; and
   the third delay circuit includes fourth and fifth circuit inputs, in which the fourth circuit input is coupled to the third delay output, and the fifth circuit input is coupled to the fourth delay outputs.

4. The multi-phase clock generation circuit of claim 1, wherein the first clock mixer circuit is configured to average a first output signal from the first delay circuit and a second output signal from the second delay circuit.

5. The multi-phase clock generation circuit of claim 1, wherein the first clock mixer circuit includes a current source coupled to the first differential amplifier and to the second differential amplifier.

6. The multi-phase clock generation circuit of claim 5, wherein:
   the first differential amplifier includes:
     a first transistor including:
       a gate terminal coupled to the first delay output;
       a source terminal coupled to the current source; and
       a drain terminal coupled to a first resistor; and
     a second transistor including:
       a gate terminal coupled to the second delay output;
       a source terminal coupled to the current source; and
       a drain terminal coupled to a second resistor; and the second differential amplifier includes:
a third transistor including:
a gate terminal coupled to the third delay output;
a source terminal coupled to the current source; and
a drain terminal coupled to the drain terminal of the first transistor and to a third resistor; and
a fourth transistor including:
a gate terminal coupled to the fourth delay output;
a source terminal coupled to the current source; and
a drain terminal coupled to the drain terminal of the second transistor and to a fourth resistor.

7. A multi-phase clock generation circuit, comprising:
a delay-locked loop including:
a first delay circuit including a first circuit input and a first circuit output, the first circuit input adapted to be coupled to a clock, and the first delay circuit configured to provide a first delayed clock signal at the first circuit output responsive to a clock signal from the clock;
a second delay circuit including a second circuit input and a second circuit output, the second circuit input coupled to the first circuit output, and the second delay circuit configured to provide a second delayed clock signal at the second circuit output responsive to the first delayed clock signal; and
a third delay circuit including a third circuit input and a third circuit output, the third circuit input coupled to the second circuit output, and the third delay circuit configured to provide a third delayed clock signal at the third circuit output responsive to the second delayed clock signal;
a first clock mixer circuit including first and second mixer inputs, the first mixer input coupled to the first circuit output, the second mixer input coupled to the second circuit output, the first clock mixer circuit configured to combine the first and second delayed clock signals, and the first clock mixer circuit including:
a first differential amplifier configured to amplify the first delayed clock signal; and
a second differential amplifier coupled to the first differential amplifier and configured to amplify the second delayed clock signal; and
a second clock mixer circuit including third and fourth mixer inputs, the third mixer input coupled to the second circuit output, the fourth mixer input coupled to the third circuit output, and the second clock mixer circuit configured to combine the second and third delayed clock signals.

8. The multi-phase clock generation circuit of claim 7, wherein:
the first delay circuit is configured to change a phase of the clock signal by 45 degrees;
the second delay circuit is configured to change a phase of the first delayed clock signal by 45 degrees; and
the third delay circuit is configured to change a phase of the second delayed clock signal by 45 degrees.

9. The multi-phase clock generation circuit of claim 7, wherein:
the first clock mixer circuit includes a first mixer output, and the first clock mixer circuit is configured to provide a first output clock signal at the first mixer output, the first output clock signal having a phase that is an average of a phase of the first delayed clock signal and a phase of the second delayed clock signal; and
the second clock mixer circuit includes a second mixer output, and the second clock mixer circuit is configured to provide a second output clock signal at the second mixer output, the second output clock signal having a phase that is an average of the phase of the second delayed clock signal and a phase of the third delayed clock signal.

10. The multi-phase clock generation circuit of claim 7, wherein the first clock mixer circuit includes a current source coupled to the first differential amplifier and to the second differential amplifier.

11. The multi-phase clock generation circuit of claim 7, wherein:
the first circuit output includes first and second differential outputs;
the second circuit output includes third and fourth differential outputs;
the first differential amplifier includes:
a first input terminal coupled to the first differential output;
a second input terminal coupled to the second differential output;
a first output terminal; and
a second output terminal; and
the second differential amplifier includes:
a third input terminal coupled to the third differential output;
a fourth input terminal coupled to the fourth differential output;
a third output terminal coupled to the first output terminal; and
a fourth output terminal coupled to the second output terminal.

12. The multi-phase clock generation circuit of claim 11, wherein:
the first clock mixer circuit includes a current source;
the first differential amplifier includes:
a first transistor including:
a gate terminal coupled to the first differential output;
a source terminal coupled to the current source; and
a drain terminal; and
a second transistor including:
a gate terminal coupled to the second differential output;
a source terminal coupled to the current source; and
a drain terminal; and
the second differential amplifier includes:
a third transistor including:
a gate terminal coupled to the third differential output;
a source terminal coupled to the current source; and
a drain terminal coupled to the drain terminal of the first transistor; and
a fourth transistor including:
a gate terminal coupled to the fourth differential output;
a source terminal coupled to the current source; and
a drain terminal coupled to the drain terminal of the second transistor.

13. A multi-phase clock generation circuit, comprising:
a first delay circuit including a first differential output;
a second delay circuit including a second differential output;
a third delay circuit including a third differential output;
a first clock mixer circuit including:
a first differential amplifier including:
a first differential input coupled to the first differential output; and
a first differential amplifier output; and a second differential amplifier including:
a second differential input coupled to the second differential output; and
a second differential amplifier output coupled to the first differential amplifier output; and
a second clock mixer circuit including:
a third differential amplifier including:
a third differential input coupled to the second differential output; and
a third differential amplifier output; and
a fourth differential amplifier including:
a fourth differential input coupled to the third differential output; and
a fourth differential amplifier output coupled to the third differential amplifier output.

14. The multi-phase clock generation circuit of claim 13, wherein:
the first delay circuit is configured to generate, at the first differential output, a first phase of a clock signal;
the second delay circuit is configured to generate, at the second differential output, a second phase of the clock signal; and
the third delay circuit is configured to generate, at the third differential output, a third phase of the clock signal.

15. The multi-phase clock generation circuit of claim 13, wherein:
the first clock mixer circuit is configured to average a first output signal from the first delay circuit and a second output signal from the second delay circuit; and
the second clock mixer circuit is configured to average the second output signal and a third output signal from the third delay circuit.

16. The multi-phase clock generation circuit of claim 13, wherein:
the first differential output includes first and second circuit outputs;
the second differential output includes third and fourth circuit outputs;
the first differential amplifier includes:
a first input terminal coupled to the first circuit output;
a second input terminal coupled to the second circuit output;
a first output terminal; and
a second output terminal; and
the second differential amplifier includes:
a third input terminal coupled to the third circuit output;
a fourth input terminal coupled to the fourth circuit output;
a third output terminal coupled to the first output terminal; and
a fourth output terminal coupled to the second output terminal.

17. The multi-phase clock generation circuit of claim 16, wherein:
the first clock mixer circuit includes a current source;
the first differential amplifier includes:
a first transistor including:
a gate terminal coupled to the first circuit output;
a source terminal coupled to the current source; and
a drain terminal; and
a second transistor including:
a gate terminal coupled to the second circuit output;
a source terminal coupled to the current source; and
a drain terminal; and
the second differential amplifier includes:
a third transistor including:
a gate terminal coupled to the third circuit output;
a source terminal coupled to the current source; and
a drain terminal coupled to the drain terminal of the first transistor; and
a fourth transistor including:
a gate terminal coupled to the fourth circuit output;
a source terminal coupled to the current source; and
a drain terminal coupled to the drain terminal of the second transistor.

18. The multi-phase clock generation circuit of claim 13, wherein:
the first clock mixer circuit includes a first current source coupled to the first differential amplifier and to the second differential amplifier; and
the second clock mixer circuit includes a second current source coupled to the third differential amplifier and to the fourth differential amplifier.

* * * * *